United States Patent
Lin et al.

(10) Patent No.: US 10,079,218 B1
(45) Date of Patent: Sep. 18, 2018

(54) TEST METHOD FOR A REDISTRIBUTION LAYER

(71) Applicant: Powertech Technology Inc., Hsinchu County (TW)

(72) Inventors: Han-Wen Lin, Hsinchu County (TW); Hung-Hsin Hsu, Hsinchu County (TW); Shang-Yu Chang-Chien, Hsinchu County (TW); Nan-Chun Lin, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 15/619,969

(22) Filed: Jun. 12, 2017

(51) Int. Cl.
*H01L 23/00* (2006.01)
*H01L 21/66* (2006.01)

(52) U.S. Cl.
CPC .............. *H01L 24/20* (2013.01); *H01L 22/20* (2013.01); *H01L 24/19* (2013.01); *H01L 2224/19* (2013.01); *H01L 2224/2101* (2013.01); *H01L 2224/215* (2013.01); *H01L 2924/01022* (2013.01); *H01L 2924/01029* (2013.01); *H01L 2924/01074* (2013.01)

(58) Field of Classification Search
CPC ......... H01L 24/20; H01L 22/20; H01L 24/19; H01L 22/10; H01L 22/12; H01L 22/24; H01L 22/14; H01L 22/30; H01L 22/34; H01L 2224/19; H01L 2224/2101; H01L 2224/215; H01L 2924/01022; H01L 2924/01074; H01L 2924/01029; H01L 25/0652; H01L 21/0273
See application file for complete search history.

(56) References Cited

U.S. PATENT DOCUMENTS

| | | | | |
|---|---|---|---|---|
| 6,566,885 | B1 * | 5/2003 | Pinto | G01N 21/66 324/501 |
| 2004/0155337 | A1 * | 8/2004 | Strandberg | H01L 23/13 257/738 |
| 2011/0037481 | A1 * | 2/2011 | Kim | G01R 31/2818 324/537 |
| 2015/0077147 | A1 * | 3/2015 | Goel | G01R 31/31851 324/750.3 |
| 2016/0266197 | A1 | 9/2016 | Roehner et al. | |

FOREIGN PATENT DOCUMENTS

TW   201307860 A   2/2013

* cited by examiner

*Primary Examiner* — Thanh T Nguyen
(74) *Attorney, Agent, or Firm* — Birch, Stewart, Kolasch & Birch, LLP

(57) ABSTRACT

A conductive layer is formed on a first surface of a first carrier. The redistribution layer is formed on the conductive layer. Then an open-test is performed to the redistribution layer. Since the conductive layer and the redistribution layer constitute a closed loop, a load should be presented during the open-test if the redistribution layer is formed correctly. After the open-test is performed, the first carrier and the conductive layer are removed. Then a short-test is performed to the redistribution layer. No load is presented during the short-test if the redistribution layer is formed correctly since the redistribution layer constitutes an open loop. Therefore, whether the redistribution layer has flaws can be determined before the dies are boned on the redistribution layer. Thus, no waste of the good die occurs because of the flawed redistribution layer.

20 Claims, 7 Drawing Sheets

TEST METHOD FOR A REDISTRIBUTION LAYER

BACKGROUND OF THE INVENTION

1. Field of the Invention

The present invention relates to a test method during manufacturing processes of the semiconductor devices, and more particularly to a test method for a redistribution layer.

2. Description of the Prior Arts

Due to the fact that portable electronic devices are widely used, more and more features are demanded to be built in the portable electronic devices. The market requires the electronic devices to be not only powerful but also thin and small. To achieve that goal, a new method is proposed to directly apply redistribution layers on surface of the combination of the silicon die and the organic compound. A redistribution layer (RDL) is a layer composed with metal traces and vias that provide the path to transmit power or signal form the pins of the dies to outer surface of the package. Normally, the IC devices require high I/O pads to deliver high performance. However, for the fixed die size, the area of the die might not be sufficient to offer spaces for large quantity of I/O pads. This problem can be solved by using the redistribution layer. At the same time, the performance is expected to be better and power consumption is lower due to shorten traces.

There are several methods to perform such technique. One of them is so-called "chip-last". Chip-last package is made by the sequence that the redistribution layers are formed on the carrier first and then the dies are bonded on the redistribution layers. In chip-last process flow, the electrical performance of the redistribution layers cannot be determined before the dies are bonded because of the incompletion of the electrical loop. In this case, if the good dies are boned on the flawed redistribution layers, the good dies are wasted, which causes yield loss and increases the cost of production.

Since the flawed redistribution layers can only be determined after the dies are boned on the redistribution layers, it is risky to bond good dies on the RDL without knowing its quality.

To overcome the shortcomings, the present invention provides a test method for a redistribution layer to mitigate or to obviate the aforementioned problems.

SUMMARY OF THE INVENTION

The main objective of the present invention is to provide a test method for a redistribution layer before the dies are bonded to the redistribution layer.

According to the present invention, a conductive layer is formed on a first surface of a first carrier. The redistribution layer is formed on the conductive layer. Then, an open-test is performed to the redistribution layer. Since the conductive layer and the redistribution layer constitute a closed loop, a load should be presented during the open-test if the redistribution layer is formed correctly. After the open-test is performed, the first carrier and the conductive layer are removed. Then a short-test is performed to the redistribution layer. No load is presented during the short-test if the redistribution layer is formed correctly since the redistribution layer constitutes an open loop. In this way, whether the redistribution layer is defective can be determined before the dies are boned on the redistribution layer. No waste of the good die can be occurred because of the flawed redistribution layer.

Other objectives, advantages and novel features of the invention will become more apparent from the following detailed description when taken in conjunction with the accompanying drawings.

DETAILED DESCRIPTION OF THE EMBODIMENTS

With reference to the attached drawings, the present invention is described by means of the embodiments below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detailed component layouts may be more complicated.

Figure 1:
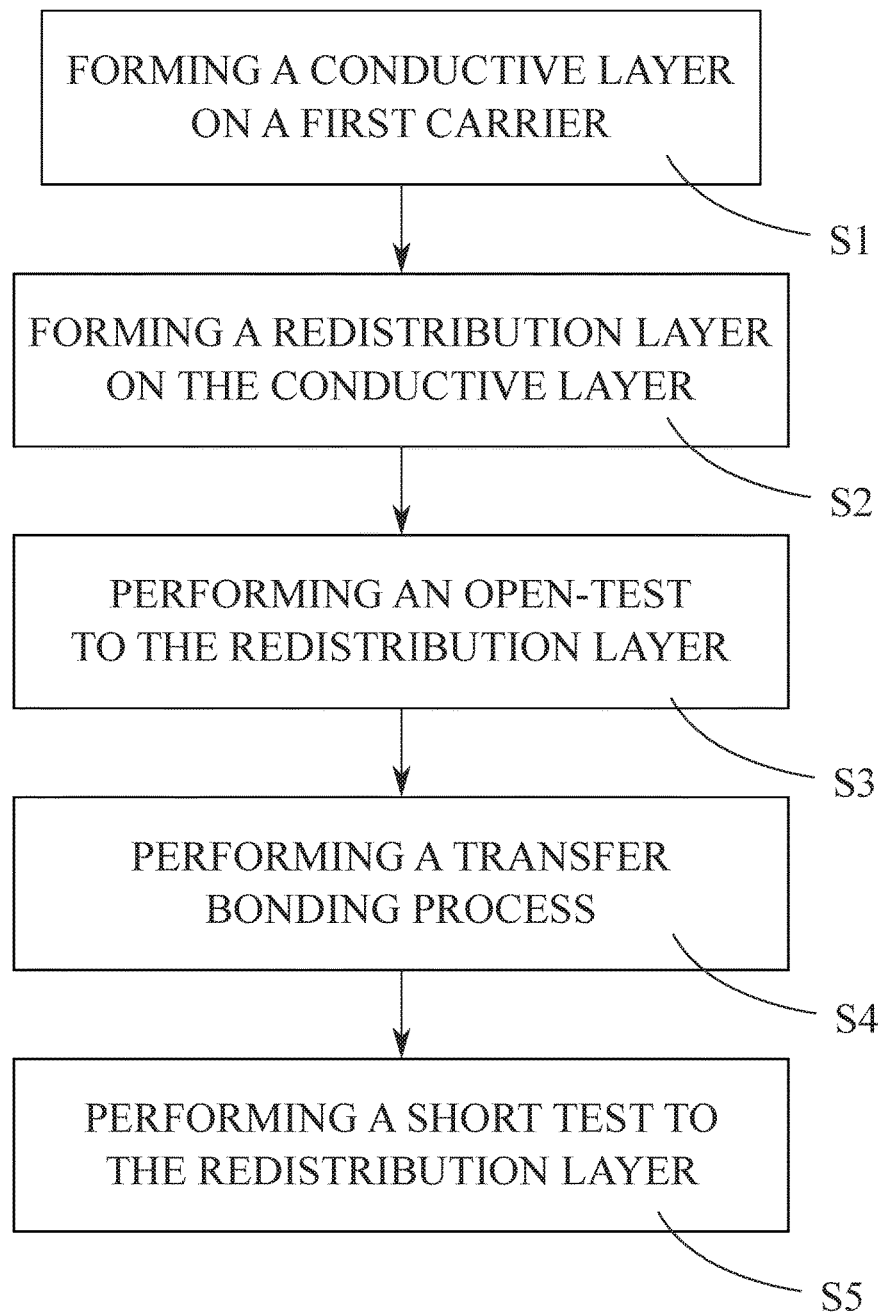
FIG. 1 is a flow chart of a first embodiment of a test method for a redistribution layer in accordance with the present invention.
Figure 2:
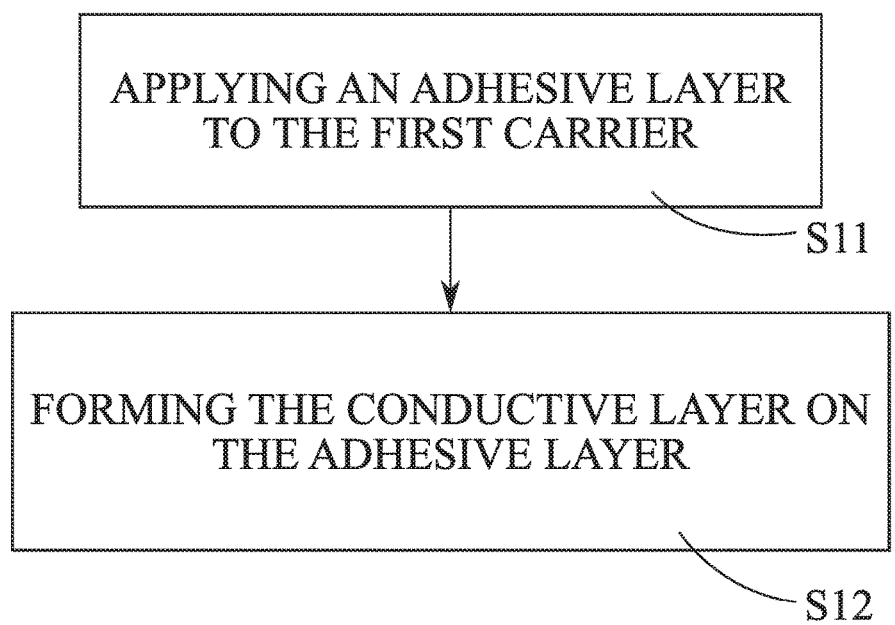
FIG. 2 is a flow chart of forming the conductive layer of the test method in FIG. 1.
Figure 3A:
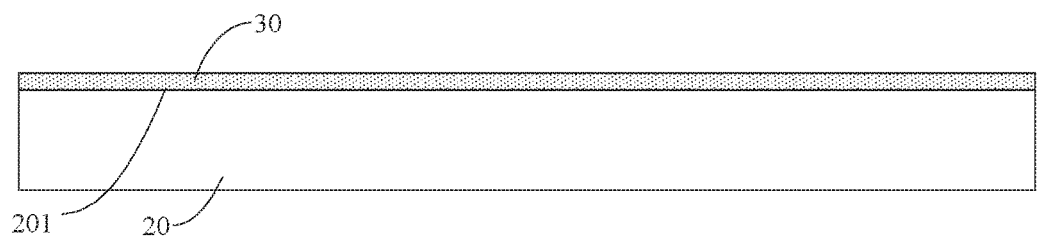
FIGS. 3A to 3B, and 4 to 5 are cross-sectional views of a structure during performing the process in FIG. 1.
Figure 3B:
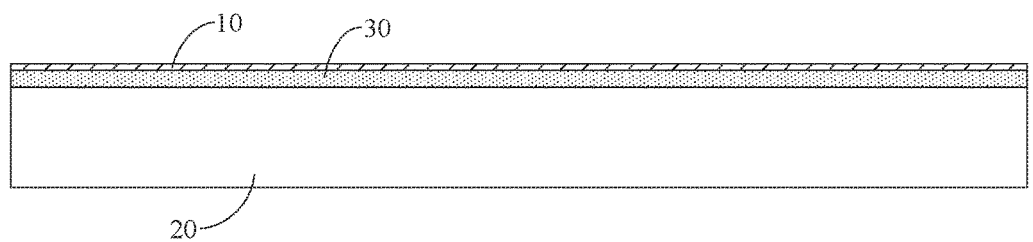

FIG. 1 illustrates a flowchart of a test method for a redistribution layer in accordance with the present invention. The test method comprises forming a conductive layer on a first carrier (S1), forming a redistribution layer on the conductive layer (S2), performing an open-test to the redistribution layer (S3), performing a transfer bonding process (S4), and performing a short test to the redistribution layer (S5).

With reference to FIGS. 1, 2, and 3A to 3B, the step of forming the conductive layer 10 on the first carrier 20 (S1) may comprise, but is not limited to, the following steps:

Applying an adhesive layer 30 to the first carrier 20 (S11) (shown in FIG. 3A): An adhesive layer 30 is applied to the first surface 201 of the first carrier 20.

Forming the conductive layer 10 on the adhesive layer 30 (S12) (shown in FIG. 3B): The conductive layer 10 is formed on the adhesive layer 30. In one embodiment, the conductive layer 10 is deposited on the adhesive layer 30. In one embodiment, the conductive layer 10 is made of metal, such as titanium (Ti), titanium-tungsten (TiW), titanium-copper (TiCu), or other metal that can be used as adhesive or seed layer.

Figure 4:
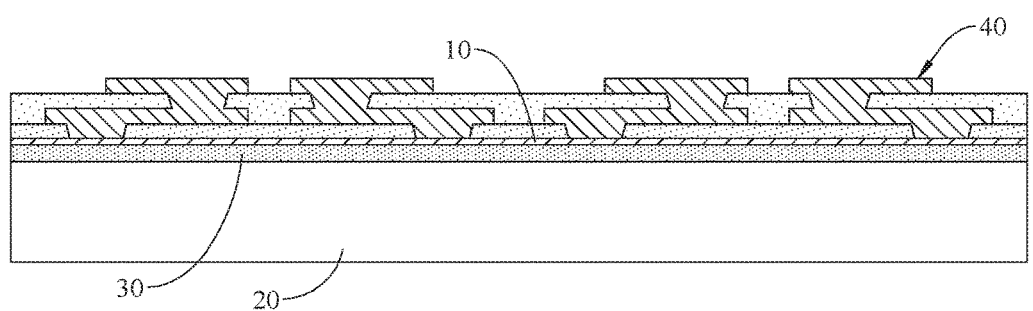

With reference to FIGS. 1 and 4, after the conductive layer 10 is formed on the first carrier 20, the redistribution layer 40 is formed on the conductive layer 10 (S2). The redistribution layer 40 may be formed by sputtering, patterned etching, patterned electrical plating, or lift-off process.

Figure 5:
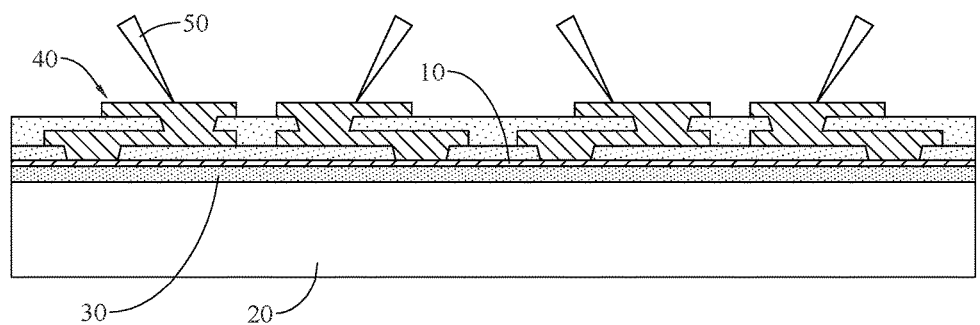

With reference to FIGS. 1 and 5, after the redistribution layer 40 is formed on the conductive layer 10, an open-test is performed to the redistribution layer 40 (S3). The redistribution layer 40 is connected electrically to a test tool 50 to perform the open-test on the redistribution layer 40.

Since the test tool 50 and the redistribution layer 40 formed on the conductive layer 10 constitute a closed loop, a load is presented during the open-test when the redistribution layer 40 is formed correctly.

Figure 6:
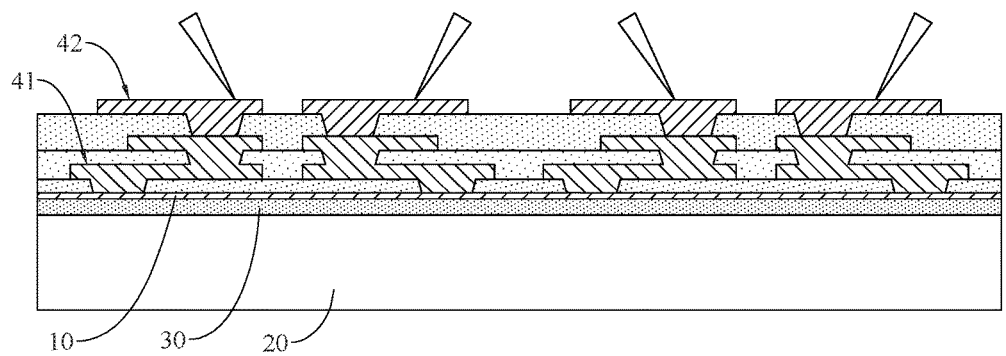
FIG. 6 is a cross-sectional view of a structure during testing subsequent redistribution layer in accordance with the present invention.

With further reference to FIG. 6, the redistribution layer 40 may comprise multiple sub-layers 41 and 42. The open-test may be performed after each sub-layer 41 or 42 of the redistribution layer 40 is formed.

Figure 7A:
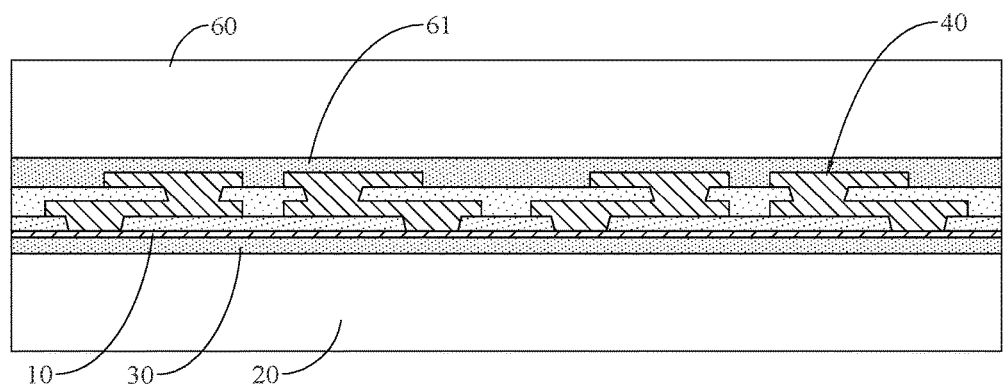
FIGS. 7A to 7B and 8 are a cross-sectional view of a structure during performing the process in FIG. 1.
Figure 7B:
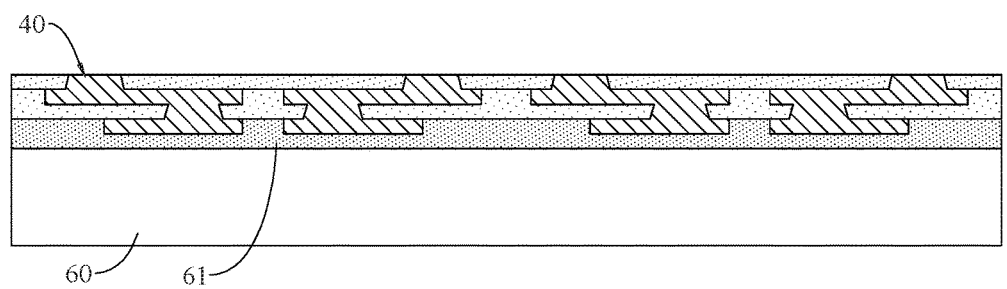

With reference to FIGS. 1 and 7A to 7B, after the open-test is performed, the conductive layer 10 is removed through the transfer bonding process (S4). The transfer bonding process is performed to bond the redistribution layer 40 on a second carrier 60 and to remove the conductive layer 10 and the first carrier 20. The second carrier 60 with a secondary adhesive layer 61 are applied to a first surface of the redistribution layer 40 opposite to a second surface of the redistribution layer 40 bonding to the conductive layer 10 and the first carrier 20. Then the first carrier 20 and the conductive layer 10 are removed to reveal the second surface of the redistribution layer 40. Thus, the second surface of the redistribution layer 40 may be bond to the die in the coming processes. In one embodiment, the conductive layer 10 may be removed in a separate process from the removal of the first carrier 20. The conductive layer 10 may be removed through an etching, a polishing, or a grinding process after the first carrier 20 has been detached. In another embodiment, the first carrier 20 and the conductive layer 10 are removed together through a grinding process. The grinding process may also be used to ensure a planar surface when the first carrier 20 and the conductive layer 10 are removed.

Figure 8:
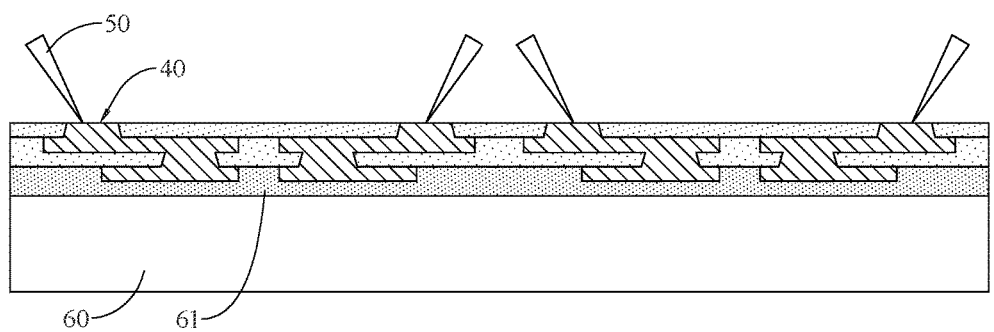

With reference to FIGS. 1 and 8, after the transfer bonding process is performed, a short test is performed to the redistribution layer 40 (S5). The redistribution layer 40 is connected electrically to a test tool 50 to perform the short-test on the redistribution layer 40. Since the test tool 50 and the redistribution layer 40 constitute an open loop, no load is presented during the short-test if the redistribution layer 40 is formed correctly.

Therefore, after the open-test and short-test are performed on the redistribution layer 40, the redistribution layer 40 is determined to be formed correctly or with defect. Furthermore, the open-test and the closed-test are separately performed on all parts of the redistribution layer 40, the quality of all of the redistribution layer 40 are assured before bonding to the dies.

Figure 9:
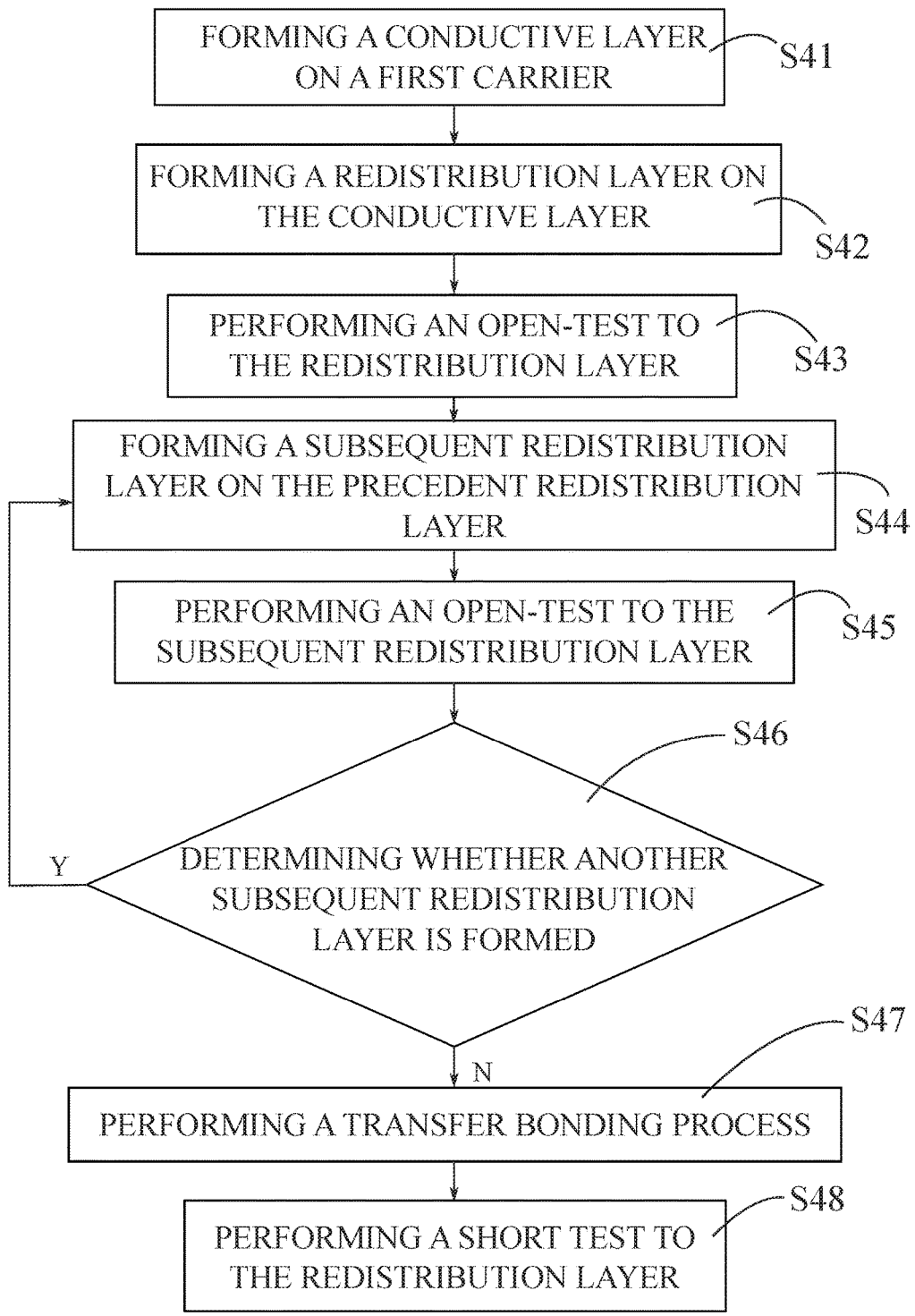
FIG. 9 is a flow chart of a second embodiment of a test method for a redistribution layer in accordance with the present invention.

In one embodiment as shown in FIG. 9, a test method for a redistribution layer in accordance with the present invention comprises steps of forming a conductive layer on a first carrier (S41), forming a redistribution layer on the conductive layer (S42), performing an open-test to the redistribution layer (S43), forming a subsequent redistribution layer on the precedent redistribution layer (S44), performing an open-test to the subsequent redistribution layer (S45), determining whether another subsequent redistribution layer is formed (S46), performing a transfer bonding process to remove the carrier and the conductive layer when no other subsequent redistribution layer is formed (S47), and performing a short test to the redistribution layer (S48). When another subsequent redistribution layer is determined to be formed, it returns to perform the step S44. Therefore, when multiple redistribution layers are formed, the open-test is performed to each redistribution layer to determine the quality of each redistribution layer.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A test method for a redistribution layer comprising steps of:
   forming a conductive layer on a first carrier;
   forming a redistribution layer on the conductive layer;
   performing an open-test to the redistribution layer;
   performing a transfer bonding process to remove the first carrier and the conductive layer and to transfer the redistribution layer on a second carrier;
   performing a short test to the redistribution layer.

2. The test method as claimed in claim 1, wherein the step of forming the conductive layer comprises steps of:
   applying an adhesive layer to the first surface of the carrier;
   forming the conductive layer on the adhesive layer.

3. The test method as claimed in claim 2, wherein the conductive layer is made of Ti, TiW, or TiCu.

4. The test method as claimed in claim 2, wherein in the transfer bonding process, the conductive layer is separately removed through an etching process, a polishing process, or a grinding process after the first carrier is detached.

5. The test method as claimed in claim 2, wherein in the transfer bonding process, the first carrier and the conductive layer are removed together through a grinding process.

6. The test method as claimed in claim 2, wherein the redistribution layer comprises of multiple sub-layers and the open-test is performed after each sub-layers of the redistribution layer is formed.

7. The test method as claimed in claim 1, wherein the conductive layer is made of Ti, TiW, or TiCu.

8. The test method as claimed in claim 7, wherein in the transfer bonding process, the conductive layer is separately removed through an etching process, a polishing process, or a grinding process after the first carrier is detached.

9. The test method as claimed in claim 7, wherein in the transfer bonding process, the first carrier and the conductive layer are removed together through a grinding process.

10. The test method as claimed in claim 7, wherein the redistribution layer comprises of multiple sub-layers and the open-test is performed after each sub-layers of the redistribution layer is formed.

11. The test method as claimed in claim 1, wherein in the transfer bonding process, the conductive layer is separately removed through an etching process, a polishing process, or a grinding process after the first carrier is detached.

12. The test method as claimed in claim 11, wherein the redistribution layer comprises of multiple sub-layers and the open-test is performed after each sub-layers of the redistribution layer is formed.

13. The test method as claimed in claim 1, wherein in the transfer bonding process, the first carrier and the conductive layer are removed together through a grinding process.

14. The test method as claimed in claim 13, wherein the redistribution layer comprises of multiple sub-layers and the open-test is performed after each sub-layers of the redistribution layer is formed.

15. The test method as claimed in claim 1, wherein the redistribution layer comprises of multiple sub-layers and the open-test is performed after each sub-layers of the redistribution layer is formed.

16. A test method for a redistribution layer comprising steps of:
   forming a conductive layer on a first carrier;
   forming a redistribution layer on the conductive layer;
   performing an open-test to the redistribution layer;
   forming a subsequent redistribution layer on the precedent redistribution layer;
   performing an open-test to the subsequent redistribution layer;
   determining whether another subsequent redistribution layer is formed;
   if another subsequent redistribution layer is determined to be formed, returning to the step of forming a subsequent redistribution layer on the precedent redistribution layer;
   if no other subsequent redistribution layer is determined to be formed, performing a transfer bonding process to remove the carrier and the conductive layer; and
   performing a short test to the redistribution layer.

17. The test method as claimed in claim 16, wherein the step of forming the conductive layer comprises steps of:
   applying an adhesive layer to the first surface of the carrier;
   forming the conductive layer on the adhesive layer.

18. The test method as claimed in claim 16, wherein the conductive layer is made of Ti, TiW, or TiCu.

19. The test method as claimed in claim 16, wherein in the transfer bonding process, the conductive layer is separately removed through an etching process, a polishing process, or a grinding process after the first carrier is detached.

20. The test method as claimed in claim 16, wherein in the transfer bonding process, the conductive layer is separately removed through a grinding process after the first carrier is detached.

* * * * *